US009293579B2

(12) United States Patent
Sell et al.

(10) Patent No.: US 9,293,579 B2
(45) Date of Patent: Mar. 22, 2016

(54) METHOD OF FORMING STACKED TRENCH CONTACTS AND STRUCTURES FORMED THEREBY

(71) Applicant: INTEL CORPORATION, Santa Clara, CA (US)

(72) Inventors: Bernhard Sell, Portland, OR (US); Oleg Golonzka, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/284,808

(22) Filed: May 22, 2014

(65) Prior Publication Data

US 2014/0252464 A1    Sep. 11, 2014

Related U.S. Application Data

(63) Continuation of application No. 12/215,991, filed on Jun. 30, 2008, now Pat. No. 8,803,245.

(51) Int. Cl.
H01L 23/48 (2006.01)
H01L 23/52 (2006.01)
H01L 29/40 (2006.01)
H01L 29/78 (2006.01)
(Continued)

(52) U.S. Cl.
CPC ...... *H01L 29/7827* (2013.01); *H01L 21/28052* (2013.01); *H01L 21/76897* (2013.01); *H01L 23/485* (2013.01); *H01L 23/5226* (2013.01); *H01L 29/4925* (2013.01); *H01L 29/66666* (2013.01); *H01L 2924/0002* (2013.01)

(58) Field of Classification Search
CPC ............... H01L 21/76897; H01L 23/5226; H01L 21/28052; H01L 29/4925; H01L 29/66666; H01L 29/7827
USPC ......... 438/655, 652, 637, 640, 672, 675, 651, 438/622, 630; 257/382, 384, 734, 758, 774, 257/754, 757
See application file for complete search history.

(56) References Cited

U.S. PATENT DOCUMENTS 6,403,996 B1   6/2002   Lee
7,064,375 B2   6/2006   Yonehama et al.
(Continued)

FOREIGN PATENT DOCUMENTS

CN    1619793 A    5/2005
CN    1713368 A    12/2005
(Continued)

OTHER PUBLICATIONS

Notice of Allowance received for U.S. Appl. No. 12/215,991, mailed on Apr. 17, 2014, 12 pages.
(Continued)

*Primary Examiner* — Thanh Y Tran
(74) *Attorney, Agent, or Firm* — Blakely, Sokoloff, Taylor & Zafman LLP

(57) ABSTRACT

Methods and associated structures of forming a microelectronic device are described. Those methods may include forming a structure comprising a first contact metal disposed on a source/drain contact of a substrate, and a second contact metal disposed on a top surface of the first contact metal, wherein the second contact metal is disposed within an IID disposed on a top surface of a metal gate disposed on the substrate.

14 Claims, 4 Drawing Sheets

(51) Int. Cl.
  *H01L 21/768* (2006.01)
  *H01L 23/485* (2006.01)
  *H01L 23/522* (2006.01)
  *H01L 21/28* (2006.01)
  *H01L 29/49* (2006.01)
  *H01L 29/66* (2006.01)

(56) References Cited

U.S. PATENT DOCUMENTS

| | | |
|---|---|---|
| 2001/0048624 A1 | 12/2001 | Morimoto |
| 2005/0059236 A1 | 3/2005 | Nishida et al. |
| 2005/0087787 A1 | 4/2005 | Ando |
| 2005/0287799 A1 | 12/2005 | Lee et al. |
| 2006/0234446 A1 | 10/2006 | Wei et al. |
| 2006/0258145 A1 | 11/2006 | Lee et al. |
| 2007/0045623 A1* | 3/2007 | Jin ................................ 257/43 |
| 2007/0262393 A1 | 11/2007 | Yoon et al. |
| 2008/0191352 A1* | 8/2008 | Yu et al. ..................... 257/751 |

FOREIGN PATENT DOCUMENTS

| | | |
|---|---|---|
| JP | 07-263551 A | 10/1995 |
| JP | 09-055499 A | 2/1997 |
| JP | 09-162387 A | 6/1997 |
| JP | 11-026757 A | 1/1999 |
| JP | 2000-031298 A | 1/2000 |
| JP | 2005-005669 A | 1/2005 |
| JP | 2005-026641 A | 1/2005 |
| JP | 2006-013424 A | 1/2006 |
| JP | 2007-134705 A | 5/2007 |
| JP | 2007-141905 A | 6/2007 |
| JP | 2007-165872 A | 6/2007 |
| KR | 10-2005-0079795 A | 8/2005 |
| WO | 2010/002718 A2 | 1/2010 |
| WO | 2010/002718 A3 | 5/2010 |

OTHER PUBLICATIONS

Office Action received for U.S. Appl. No. 12/215,991, mailed on Aug. 18, 2011, 12 pages.
Office Action received for U.S. Appl. No. 12/215,991, mailed on Aug. 23, 2012, 13 pages.
Office Action received for U.S. Appl. No. 12/215,991, mailed on Dec. 9, 2013, 14 pages.
Office Action received for U.S Appl. No. 12/215,991, mailed on Mar. 6, 2012, 13 pages.
Office Action received for U.S. Appl. No. 12/215,991, mailed on Mar. 4, 2011, 11 pages.
Office Action received for U.S. Appl. No. 12/215,991, mailed on Mar. 27, 2013, 13 pages.
Office Action received for Chinese Patent Application No. 200980110704.1, mailed on Jul. 9, 2014, 16 pages of Office Action including 9 pages of English Translation.
Notice of Allowance received for Korean Patent Application No. 10-2010-7021369, mailed on Jan. 3, 2013, 1 pages of English Translation and 2 pages of Korean NOA.
Office Action received for Korean Patent Application No. 10-2010-7021369, mailed on Nov. 25, 2011, 4 pages of English Translation only.
Office Action received for Korean Patent Application No. 10-2010-7021369, mailed on Oct. 17, 2012, 2 pages of English Translation only.
Office Action received for Chinese Patent Application No. 200980110704.1, mailed on Apr. 9, 2013, 8 pages of English Translation and 4 pages of Chinese Office Action.
Office Action received for Chinese Patent Application No. 200980110704.1, mailed on Aug. 8, 2012, 7 pages of English Translation and 4 pages of Chinese Office Action.
Office Action received for Chinese Patent Application No. 200980110704.1, mailed on Sep. 23, 2011, 10 pages of English Translation and 5 pages of Chinese Office Action.
Notice of Allowance received for Japanese Patent Application No. 2011-509802, mailed on Dec. 3, 2013, 1 pages of NOA only.
Office Action received for Japanese Patent Application No. 2011-509802, mailed on Dec. 18, 2012, 4 pages of English Translation and 3 pages of Japanese Office Action.
Office Action received for Japanese Patent Application No. 2011-509802, mailed on Aug. 6, 2013, 2 pages of English Translation and 2 pages of Japanese Office Action.
International Preliminary Report on Patentability and Written Opinion received for PCT Patent Application No. PCT/US2009/048764, mailed on Jan. 13, 2011, 8 pages.
International Search Report and Written Opinion received for PCT Patent Application No. PCT/US2009/048764, mailed on Feb. 3, 2010, 13 pages.
Decision on Reexamination from the P.R. China State Intellectual Property Office for Chinese Patent Application No. 200980110704.1 dated Mar. 19, 2015 and English Translation thereof.

\* cited by examiner

METHOD OF FORMING STACKED TRENCH CONTACTS AND STRUCTURES FORMED THEREBY

CROSS-REFERENCE TO RELATED APPLICATION

This application is a continuation of and claims priority to U.S. patent application Ser. No. 12/215,991, filed Jun. 30, 2008, the entire disclosure of which is incorporated herein by reference.

BACK GROUND OF THE INVENTION

Contact to gate shorts become an increasingly difficult problem for integrated circuits with scaled dimensions. While a metal gate process which forms a salicide through the contact hole may be beneficial in reducing such shorts, a contact process that increases the contact to gate registration margin is necessary to further reduce the contact to gate shorts to a manufacturable level.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
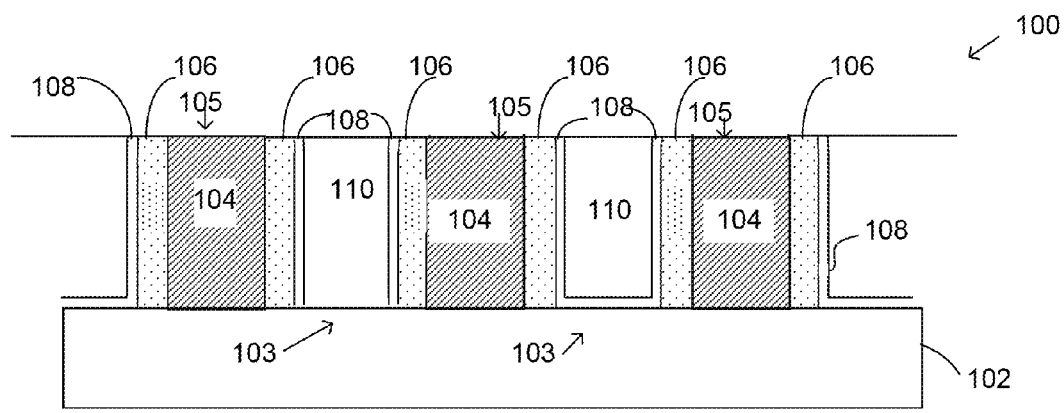
FIGS. 1a-1g represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may include forming a contact opening in a first ILD disposed on a substrate, wherein a source/drain contact area is exposed, forming a silicide on the source/drain contact area, forming a first contact metal in the contact opening to fill the contact opening, polishing the first contact metal to planarize a top surface of the first contact metal with a top surface of a gate disposed on the substrate, depositing a second ILD on the top surface of the gate, forming a second contact opening in the second ILD, and forming a second contact metal in the second contact opening, wherein the first and second contact openings are conductively coupled. Methods of the present invention increase the contact to gate registration margin and reduce contact to gate shorts.

Methods of the present invention are depicted in FIGS. 1a-1g. FIG. 1a shows a cross section of a portion of a transistor structure 100 comprising a substrate 102, and a gate 104, which may comprise a metal gate in some embodiments, and may comprise such metal gate materials as hafnium, zirconium, titanium, tantalum, or aluminum, or combinations thereof, for example. The gate 104 may comprise a top surface 105. The substrate 102 may be comprised of materials such as, but not limited to, silicon, silicon-on-insulator, germanium, indium antimonide, lead telluride, indium arsenide, indium phosphide, gallium arsenide, gallium antimonide, or combinations thereof.

The transistor structure 100 may further comprise a spacer material 106, that may be adjacent and in direct contact with the gate 104. The spacer material 106 may comprise a dielectric material in some cases, such as but not limited to silicon dioxide and/or silicon nitride materials. The transistor structure 100 may further comprise a nitride etch stop layer (nesl) 108, that may be adjacent and in direct contact with the spacer material 106. The nesl 108 may serve as an etch stop layer in some embodiments. The transistor structure 100 may further comprise a first interlayer dielectric (ILD) 110 that may serve as an isolation layer in some embodiments, and may be disposed adjacent to and in direct contact with the nesl 108 in some cases.

Figure 1B:
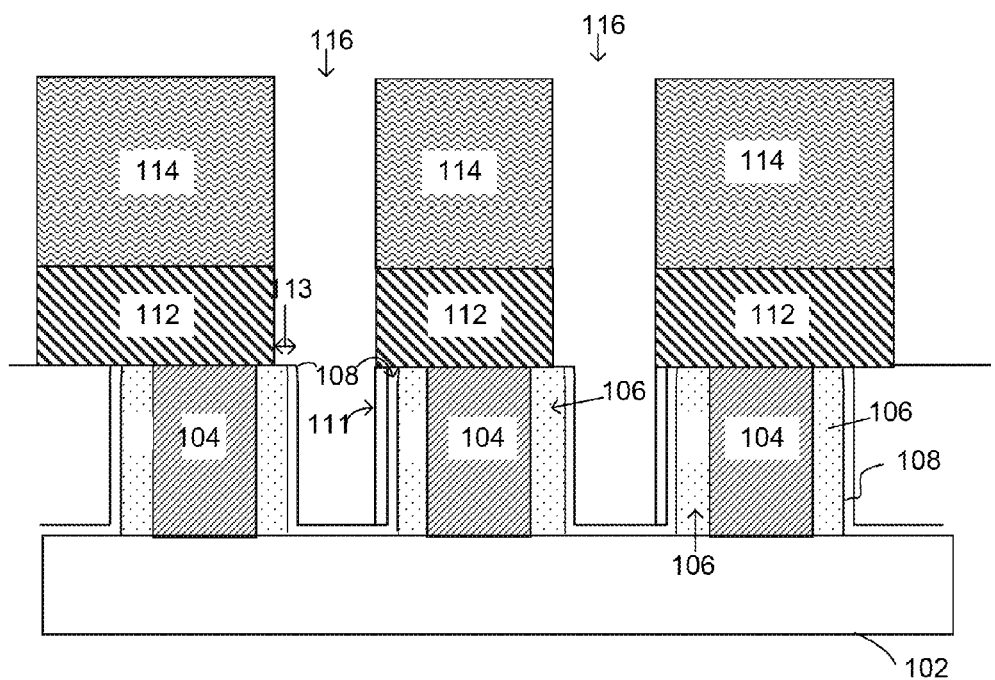

A sacrificial stopping layer 112 may be formed on the top surface 105 of the gate 104, that may comprise a nitride and/or a silicon carbide material in some cases (FIG. 1b). A resist layer 114 may be formed on the stopping layer 112 utilizing any suitable patterning process, such as a photolithography process, for example. The resist layer 114 may be formed to define an opening 116, such as a trench contact opening 115, for a source/drain region 103 of the substrate 100. A portion of the stopping layer 112 and a portion of the ILD 110 may be disposed on top surfaces of the gate 104, the adjacent spacer material and on the adjacent nesl that are disposed on the substrate.

In an embodiment, a dry etch process may be utilized to form the opening 116, in which portions of the stopping layer 112 and the first ILD 110 may be removed. In an embodiment, the etching process may comprise an oxide etch that may be selective to the nitride etch stop layer (nesl) 108 and to the spacer material 106, and may remove the first ILD 110 in a substantially anisotropic manner, leaving the nesl 108 and the spacer material 106 substantially intact. In other words, the oxide ILD may etch at a much higher etch rate in the etch process chemistry than the spacer material 106 and the nesl 108. In an embodiment, a portion of the stopping layer 112 and a portion of the ILD 110 may be removed that are disposed on top surfaces of the gate 104, the an adjacent spacer 106, and on the adjacent nesl 108, to form the contact opening 116.

The patterning process may result in a mis-registration of the resist layer 114, wherein the resist layer 114 may be mis-aligned so that a portion 113 of the spacer material 106 may be exposed during the formation of the opening 115, and a portion 111 of the first ILD 110 may remain covered with the resist layer 114. The amount of misregistration of the resist layer 114 may vary depending upon the particular application, but may become more significant as the aspect ratio of the opening 116 increases. For example, microelectronic devices comprising small geometries will be more likely to form a short between the contact and the gate due to resist layer 114 misalignment.

Figure 1C:
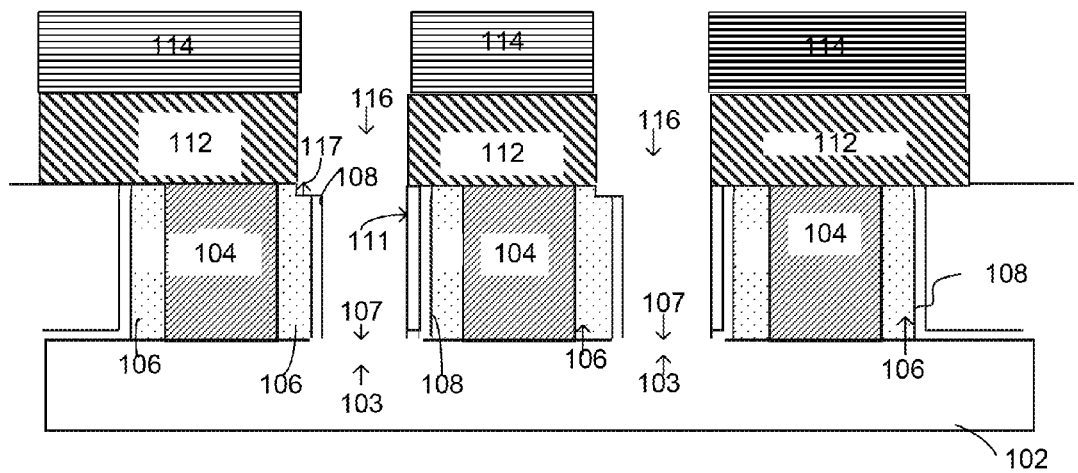

Subsequently, the nitride etch stop layer 108 may be removed that is disposed on a portion of the source/drain region 103 of the substrate 100 utilizing a nitride etching process, for example, so that a source/drain contact area 107 may be exposed (FIG. 1c). Alternatively, the nitride etch stop layer 108 may not be present on the substrate 102, and thus the nesl 108 will not need to be removed. In another embodiment, the nesl etch may be optional, depending on the selectivity of the ILD removal process, such that when the ILD etch is selective to the substrate, the nesl etch does not need to be performed.

Figure 1D:
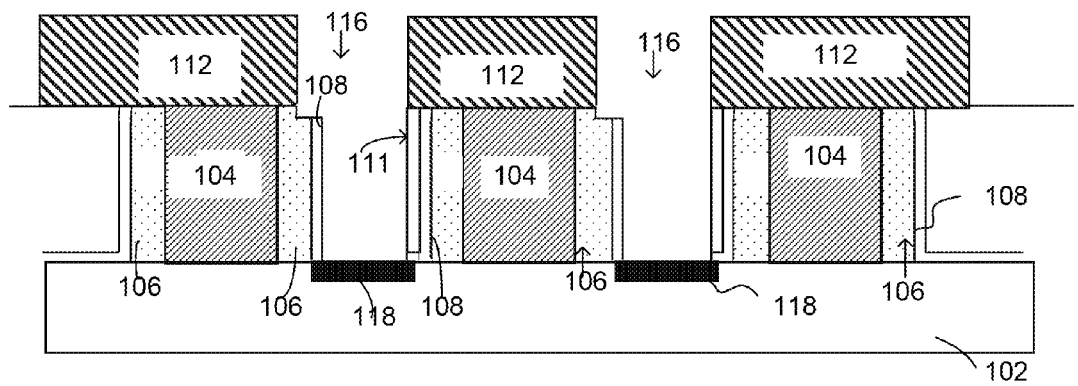

A depth 117 into the exposed portion 113 of the spacer material 106 may be formed by the nesl 108 etch and/or the ILD etch due to the misregistration of the resist layer 114. The depth 117 that may be created may vary depending upon the particular process parameters. In an embodiment, the depth 117 correlates/corresponds to an etch time of the contact etch (nesl and/or ILD etch). The resist layer 114 may then be removed and a salicide 118 may be formed on/in the source/drain contact area 107 using any suitable salicide process as are known in the art, such as but not limited to a nickel salicide process and/or other such salicide process (FIG. 1d).

Figure 1E:
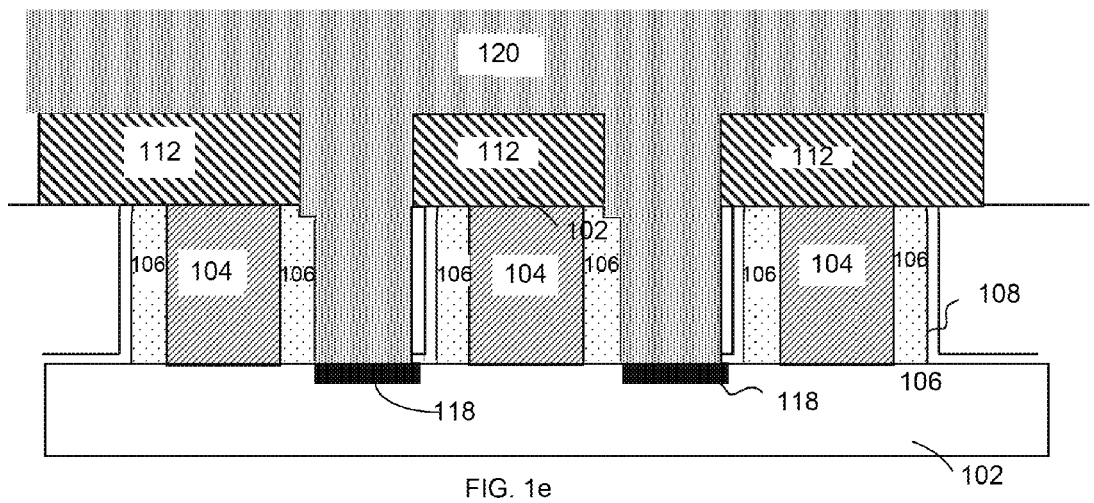
Figure 1F:
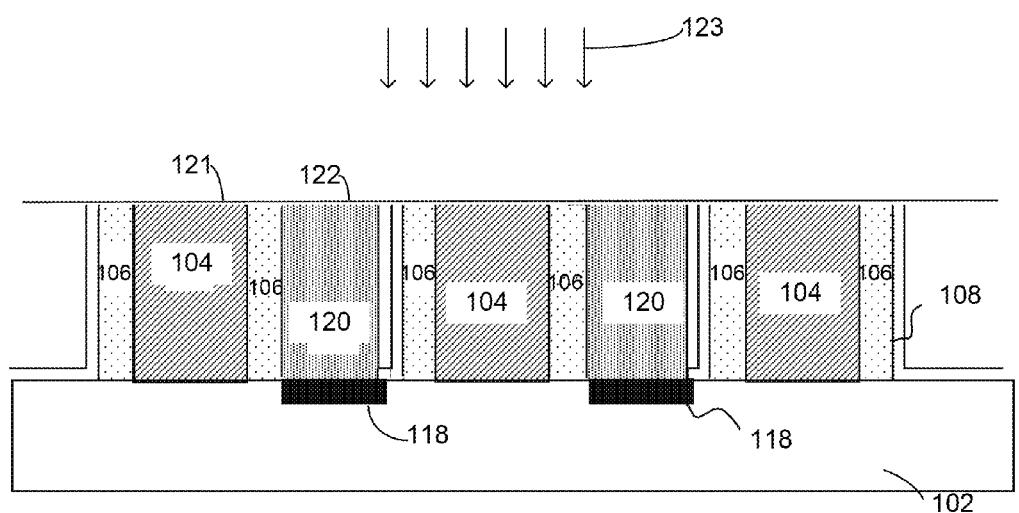

A first contact metal 120 may be formed on the salicide 118 and may fill the opening 116 (FIG. 1e). In an embodiment, the first contact metal 120 may be formed utilizing a process possessing good gap fill properties to ensure that there are little to no voids formed in the contact opening 116. Such a process may include a chemical vapor deposition (CVD) process, for example. A polishing process 123 may subsequently be performed, such as a chemical mechanical polishing (CMP) process, for example, to remove the first contact metal 120 (FIG. 1f) and the stopping layer 112. The first contact metal may comprise at least one of tungsten, titanium, titanium nitride and titanium tungsten in some cases, but may comprise any suitable contact material, according to the particular application.

In an embodiment, the first contact metal 120 may be planarized with a planarized top surface 121 of the gate 104, i.e., it may be polished by the polishing process 123 so that a top surface 122 of the first contact metal 120 may be planar with the planarized top surface 121 of the gate 104. The polishing process 123 needs to comprise a sufficient amount of overpolish time so that any stringers that could connect the contact metal 120 with the gate 104 are removed. The polishing process 123 additionally removes the depth 117 of the exposed portion 113 of the spacer material 106 that was due to the misregistration of the resist layer 114 (referring back to FIG. 1c). In an embodiment, the first contact metal 120 may comprise a non-tapered first contact metal 120.

Figure 1G:
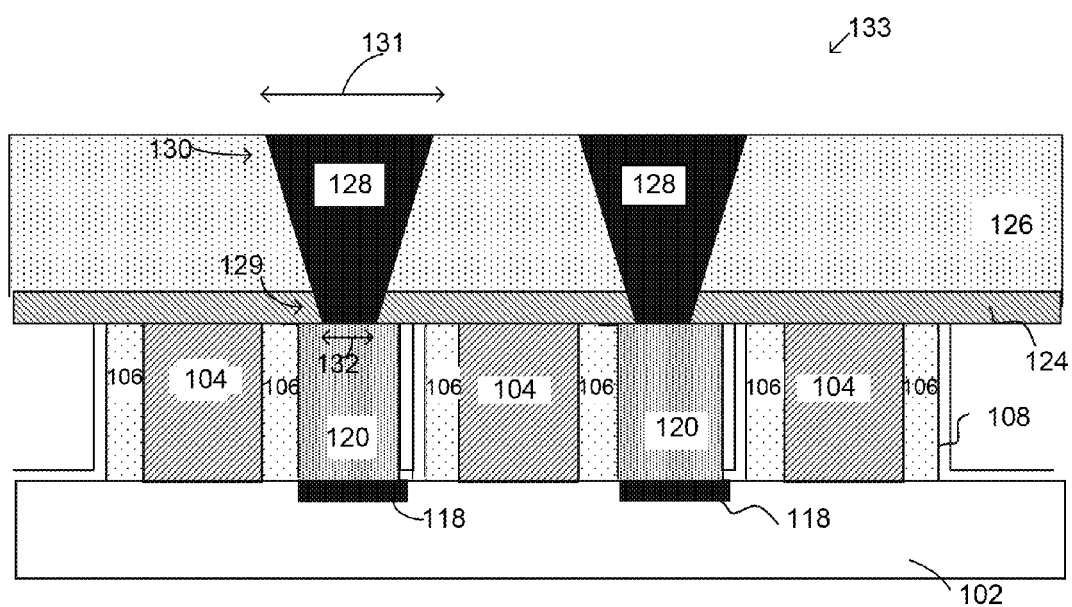

An additional gate etch stop layer 124 may be formed on the planarized top surface 121 of the gate 104, and on the top surface 122 of the contact metal 120 (FIG. 1g). A second ILD 126 may be formed on the additional gate etch stop layer 124. A second opening may be formed (not shown) that may be filled with a second contact metal 128, that may be conductively coupled and may form an ohmic contact with the first contact metal 120, and that may be disposed on the top surface 122 of the first contact metal. The second opening may be formed such that the second contact metal 128 can be tapered and a bottom portion 129 of the second contact metal 128 can be very small compared to a top portion 130 of the second contact metal 128, since the salicide does not have to be formed through this second opening.

In an embodiment, the top portion 130 comprises a larger diameter 131 than a diameter 132 of the bottom portion 129 of the second contact metal 128. The large taper of the second contact metal 128 may increase the contact-to-gate registration window significantly compared to prior art single contact processes. Thus, a stacked contact structure 133 may be formed that is higher than the gate 104. The metal to metal contact of the first contact structure 120 and the second contact structure 128 affords much more flexibility on the shape of the stacked contact structure 133 (that may comprise a vertically stacked dual contact structure) within a transistor structure, thus increasing the amount of misregistration error process window without creating the possibility of touching (shorting) the gate 104.

Embodiments of the present invention enable a simple, unique method for integrating a stacked trench contact with a metal gate process, such as a dual metal gate process, for example, that increases contact to gate registration margin and decreases the aspect ratio of the contact during a salicide process. In an embodiment, the source drain trench contact structure consists of two vertically stacked contacts. The metal gate may be formed before the first source/drain contact, a salicide may be formed after the first source/drain contact is opened and before the second source/drain contact opening is formed. Prior art contact processes have used a single trench contact process, which may not be scalable to very small technology nodes.

Further advantages of this invention include the enabling of the formation of larger contacts with better contact to gate registration margin with relatively small process changes as compared with prior art processing. The embodiments of the present invention allow for an increased process window for contact misalignment that will not lead to a change in overlap capacitance of a microelectronic device, such as a transistor, fabricated according to the methods of the present invention.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic structures are well known in the art. Therefore, it is appreciated that the Figures provided herein illustrate only portions of exemplary microelectronic structures that pertain to the practice of the present invention. Thus the present invention is not limited to the structures described herein.

What is claimed is:
1. A transistor on a substrate comprising:
   a gate structure comprising a gate electrode layer, the gate electrode having a top surface;
   a source region on a first side of the gate structure;
   a first spacer on the first side of the gate structure and in direct contact with the gate structure;
   a first silicide layer on a top surface of the source region, wherein the first silicide layer does not extend below the first spacer;
   a drain region on a second side of the gate structure;
   a second spacer on the second side of the gate structure and in direct contact with the gate structure;
   a second silicide layer on a top surface of the drain region, wherein the second silicide layer does not extend below the second spacer;

a first ILD on the first side and the second side of the gate structure and having a top surface which is coplanar with the top surface of the gate electrode;

a second ILD layer over the first ILD layer;

a first contact metal in the first ILD layer coupled to the first silicide layer;

a second contact metal within the second ILD layer that is directly coupled to the first contact metal, wherein the second contact metal comprises a tapered structure having a bottom portion that is smaller in width than a top portion of the second contact metal;

a third contact metal in the first ILD layer coupled to the second silicide layer; and a fourth contact metal within the second ILD layer that is directly coupled to the third contact metal, wherein the fourth contact metal comprises a tapered structure having a bottom portion that is smaller in width than a top portion of the fourth contact metal.

2. The transistor of claim 1, wherein the second contact metal further comprises having a bottom portion that is smaller in width than a top portion of the first contact metal.

3. The transistor of claim 1, wherein the fourth contact metal further comprises having a bottom portion that is smaller in width than a top portion of the third contact metal.

4. The transistor of claim 1, wherein gate electrode layer comprises hafnium, zirconium, titanium, tantalum, or aluminum.

5. The transistor of claim 1, wherein the substrate comprises silicon, silicon-on-insulator, germanium, indium antimonide, lead telluride, indium arsenide, indium phosphide, gallium arsenide, or gallium antimonide.

6. The transistor of claim 1, wherein the first and second spacers comprise silicon dioxide or silicon nitride.

7. The transistor of claim 1, wherein the first and second silicide layers comprise nickel salicide.

8. A method of forming a transistor on a substrate comprising:

forming a gate structure comprising a gate electrode layer on the substrate;

forming a source region on a first side of the gate structure;

forming a first spacer on the first side of the gate structure and in direct contact with the gate structure;

forming a drain region on a second side of the gate structure;

forming a second spacer on the second side of the gate structure and in direct contact with the gate structure;

forming a first ILD layer over the transistor;

etching a first trench contact opening in the first ILD layer to expose at least a portion of the source region;

through the first trench contact opening, forming a first salicide layer on a top surface of the source region;

filling the first trench contact opening with a metal to form a first trench contact;

etching a second trench contact opening in the first ILD layer that exposes at least a portion of the drain region;

through the second trench contact opening, forming a second salicide layer on a top portion of the drain region;

filling the second trench contact opening with a metal to form a second trench contact;

forming a second ILD layer over the first ILD layer;

etching a third trench contact opening in the second ILD layer that exposes at least a portion of the first trench contact, wherein the third trench contact opening has a tapered shape so that a bottom portion of the third trench contact opening is smaller in width than a top portion of the third trench contact opening;

filling the third trench contact opening with a metal to form a third trench contact;

etching a fourth trench contact opening in the second ILD layer that exposes at least a portion of the second trench contact, wherein the fourth trench contact opening has a tapered shape so that a bottom portion of the fourth trench contact opening is smaller in width than a top portion of the fourth trench contact opening; and filling the fourth trench contact opening with a metal to form a fourth trench contact.

9. The method of claim 8, wherein the third trench contact opening further has a bottom portion that is smaller in width than a top portion of the first trench contact.

10. The method of claim 8, wherein the fourth trench contact opening further has a bottom portion that is smaller in width than a top portion of the second trench contact.

11. The method of claim 8, wherein gate electrode layer comprises hafnium, zirconium, titanium, tantalum, or aluminum.

12. The method of claim 8, wherein the substrate comprises silicon, silicon-on-insulator, germanium, indium antimonide, lead telluride, indium arsenide, indium phosphide, gallium arsenide, or gallium antimonide.

13. The method of claim 8, wherein the first and second spacers comprise silicon dioxide or silicon nitride.

14. The method of claim 8, wherein the first and second silicide layers comprise nickel salicide.

* * * * *